(12) United States Patent
Ahrendes et al.

(10) Patent No.: US 11,091,398 B2
(45) Date of Patent: Aug. 17, 2021

(54) METHOD FOR MANUFACTURING LARGE CERAMIC CO-FIRED ARTICLES

(71) Applicant: Morgan Advanced Ceramics, Inc., Hayward, CA (US)

(72) Inventors: Samuel H. Ahrendes, San Jose, CA (US); Gary D. Harland, Camas, WA (US); Chengtsin Lee, Union City, CA (US); Edward Tomasek, Costa Mesa, CA (US); George York, Citrus Height, CA (US)

(73) Assignee: Morgan Advanced Ceramics, Inc., Hayward, CA (US)

( * ) Notice: Subject to any disclaimer, the term of this patent is extended or adjusted under 35 U.S.C. 154(b) by 0 days.

(21) Appl. No.: 16/836,720

(22) Filed: Mar. 31, 2020

(65) Prior Publication Data

US 2020/0231509 A1 Jul. 23, 2020

Related U.S. Application Data

(63) Continuation of application No. 15/308,417, filed as application No. PCT/EP2015/060126 on May 7, 2015, now abandoned.
(Continued)

(51) Int. Cl.
*B32B 18/00* (2006.01)
*C04B 37/02* (2006.01)
(Continued)

(52) U.S. Cl.
CPC ............ *C04B 37/021* (2013.01); *B32B 18/00* (2013.01); *C04B 35/632* (2013.01);
(Continued)

(58) Field of Classification Search
CPC . C04B 37/003; C04B 37/001; C04B 2237/62; C04B 35/106
See application file for complete search history.

(56) References Cited

U.S. PATENT DOCUMENTS 5,411,563 A    5/1995 Yeh et al.
5,855,995 A *  1/1999 Haq .......................... A61N 1/02
                                                    428/210
(Continued)

FOREIGN PATENT DOCUMENTS

JP    07302728 A  * 11/1995
JP    07302728 A    11/1995

OTHER PUBLICATIONS

Ishikawa, "JP 07-302728, machine translation", published Nov. 14, 1995 (Year: 1995).*
(Continued)

*Primary Examiner* — Alex B Efta
(74) *Attorney, Agent, or Firm* — Kilpatrick Townsend & Stockton LLP

(57) ABSTRACT

A method of forming one or more high temperature co-fired ceramic articles, comprising the steps of:—
a) forming a plurality of green compacts, by a process comprising dry pressing a powder comprising ceramic and organic binder to form a green compact;
b) disposing a conductor or conductor precursor to at least one surface of at least one of the plurality of green compacts to form at least one patterned green compact;
c) assembling the at least one patterned green compact with one or more of the plurality of green compacts or patterned green compacts or both to form a laminated assembly;
d) isostatically pressing the laminated assembly to form a pressed laminated assembly;
(Continued)

e) firing the pressed laminated assembly at a temperature sufficient to sinter the ceramic layers together.

13 Claims, 10 Drawing Sheets

Related U.S. Application Data

(60) Provisional application No. 61/989,656, filed on May 7, 2014.

(51) Int. Cl.
| | |
|---|---|
| *C04B 35/638* | (2006.01) |
| *C04B 35/632* | (2006.01) |
| *H01L 21/683* | (2006.01) |
| *H01L 21/67* | (2006.01) |
| *H05B 3/28* | (2006.01) |

(52) U.S. Cl.
CPC ...... *C04B 35/638* (2013.01); *H01L 21/67103* (2013.01); *H01L 21/6833* (2013.01); *H05B 3/283* (2013.01); *C04B 2235/3217* (2013.01); *C04B 2235/5409* (2013.01); *C04B 2235/5436* (2013.01); *C04B 2235/602* (2013.01); *C04B 2235/604* (2013.01); *C04B 2235/6025* (2013.01); *C04B 2235/6028* (2013.01); *C04B 2235/6562* (2013.01); *C04B 2235/6582* (2013.01); *C04B 2235/668* (2013.01); *C04B 2235/77* (2013.01); *C04B 2235/95* (2013.01); *C04B 2235/9615* (2013.01); *C04B 2235/9638* (2013.01); *C04B 2237/34* (2013.01); *C04B 2237/343* (2013.01); *C04B 2237/346* (2013.01); *C04B 2237/348* (2013.01); *C04B 2237/365* (2013.01); *C04B 2237/366* (2013.01); *C04B 2237/368* (2013.01); *C04B 2237/403* (2013.01); *C04B 2237/562* (2013.01); *C04B 2237/62* (2013.01); *C04B 2237/68* (2013.01); *C04B 2237/704* (2013.01); *C04B 2237/706* (2013.01); *H01L 21/6831* (2013.01); *H05B 2203/017* (2013.01)

(56) References Cited

U.S. PATENT DOCUMENTS

| | | | |
|---|---|---|---|
| 6,174,829 B1 | 1/2001 | Jean et al. | |
| 6,225,606 B1 | 5/2001 | Tsuruta et al. | |
| 6,388,861 B1 | 5/2002 | Frutiger | |
| 6,447,712 B1* | 9/2002 | Dogan | C04B 33/32 264/607 |
| 6,475,606 B2* | 11/2002 | Niwa | C04B 41/009 219/538 |
| 7,387,977 B2* | 6/2008 | Mori | C04B 35/63416 501/127 |
| 7,494,557 B1 | 2/2009 | Peterson | |
| 7,833,370 B2 | 11/2010 | Kawamura et al. | |
| 2001/0046112 A1 | 11/2001 | Herchen | |
| 2003/0044653 A1 | 3/2003 | Hiramatsu et al. | |
| 2004/0097359 A1* | 5/2004 | Hiramatsu | C04B 35/565 501/98.4 |
| 2006/0228585 A1 | 10/2006 | Needes et al. | |
| 2006/0234021 A1 | 10/2006 | Tanei et al. | |
| 2008/0062614 A1 | 3/2008 | Goia | |
| 2008/0314865 A1* | 12/2008 | Ok | H05K 3/0044 216/17 |
| 2009/0211687 A1 | 8/2009 | Iguchi et al. | |
| 2009/0284894 A1 | 11/2009 | Cooke | |
| 2010/0248927 A1* | 9/2010 | Arashi | C04B 35/62685 501/32 |
| 2012/0248716 A1 | 10/2012 | Nobori et al. | |
| 2013/0285336 A1* | 10/2013 | Ito | H01B 1/08 279/128 |

OTHER PUBLICATIONS

International Patent Application No. PCT/EP2015/060126, Search Report and Written Opinion, dated Jan. 7, 2016.
International Patent Application No. PCT/EP2015/060126, Written Opinion of the International Preliminary Examining Authority, dated May 3, 2016.
International Patent Application No. PCT/EP2015/060126, International Preliminary Report on Patentability, dated Aug. 19, 2016.
Europe Patent Application No. 15722162.3, Examination Report, dated Apr. 5, 2018.
Ishikawa et al., JP 07-302728, machine translation, published Nov. 14, 1995.
U.S. Appl. No. 15/308,417, Restriction Requirement, dated Feb. 5, 2018.
U.S. Appl. No. 15/308,417, Non-Final Rejection, dated Aug. 9, 2018.
U.S. Appl. No. 15/308,417, Final Rejection, dated Mar. 21, 2019.
U.S. Appl. No. 15/308,417, Non-Final Rejection, dated Sep. 19, 2019.
U.S. Appl. No. 15/308,417, Final Rejection, dated Jan. 21, 2020.

* cited by examiner

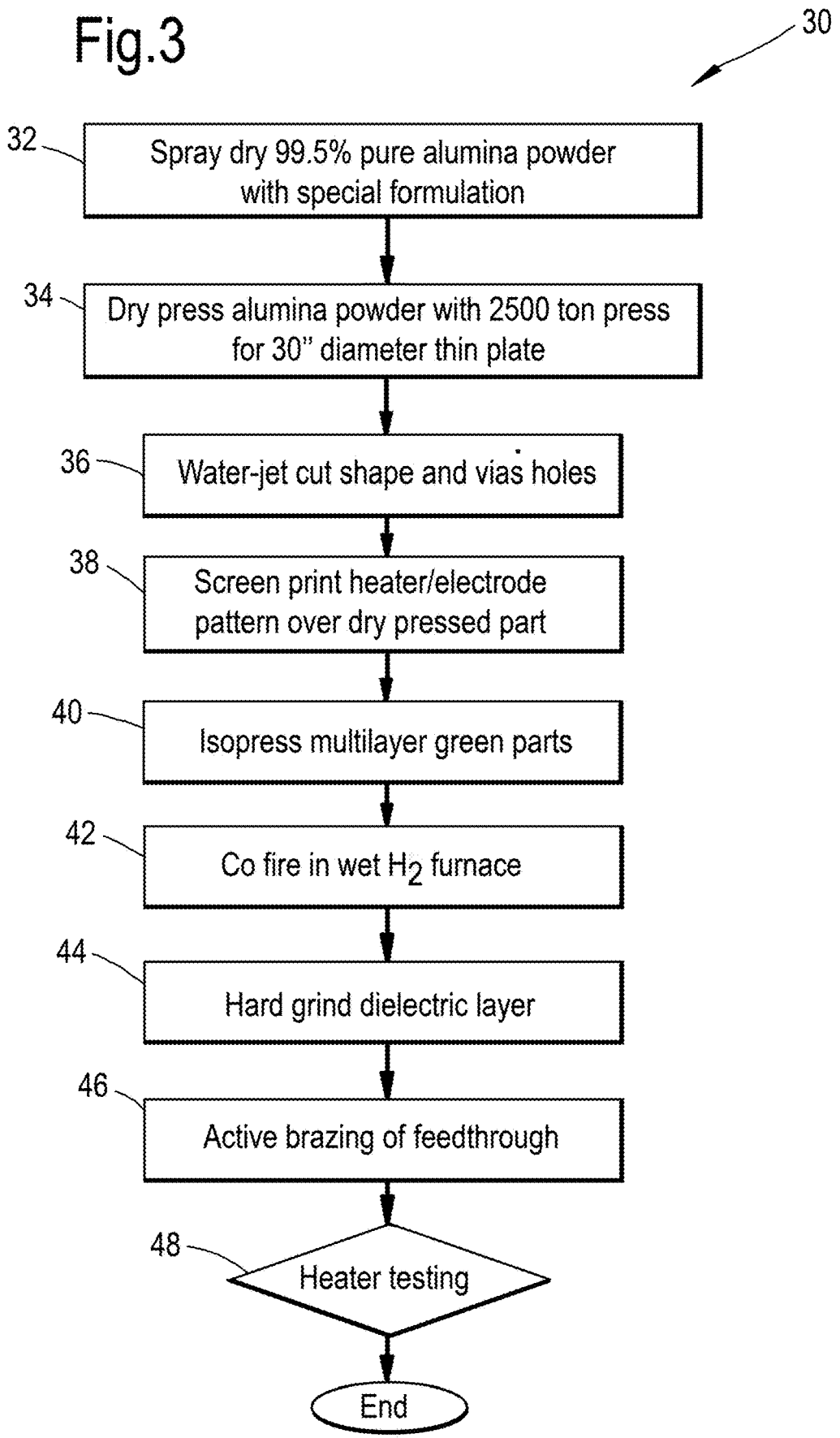

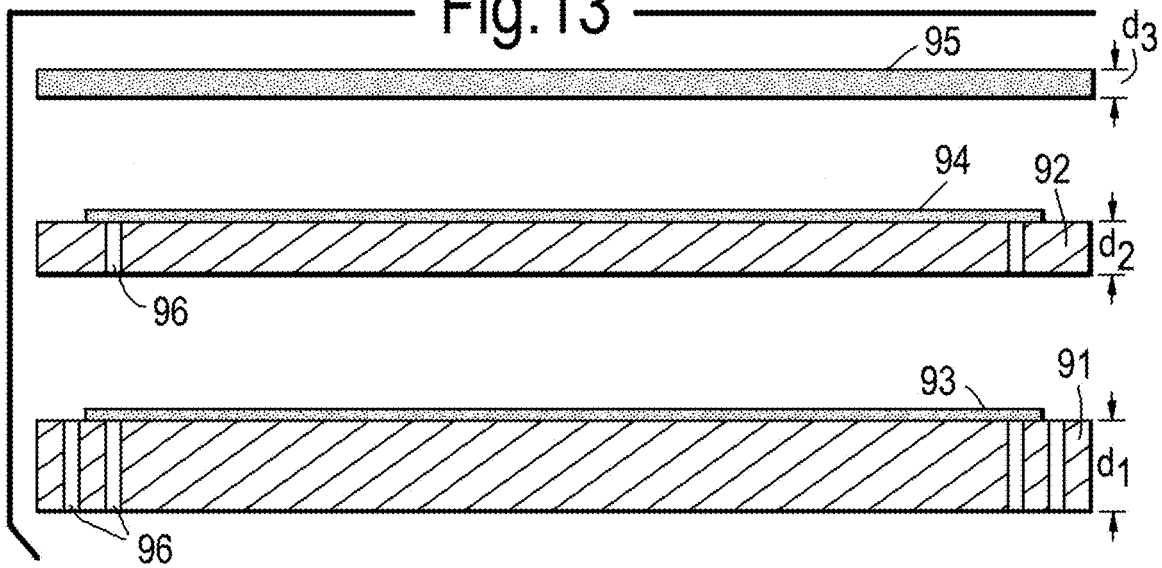
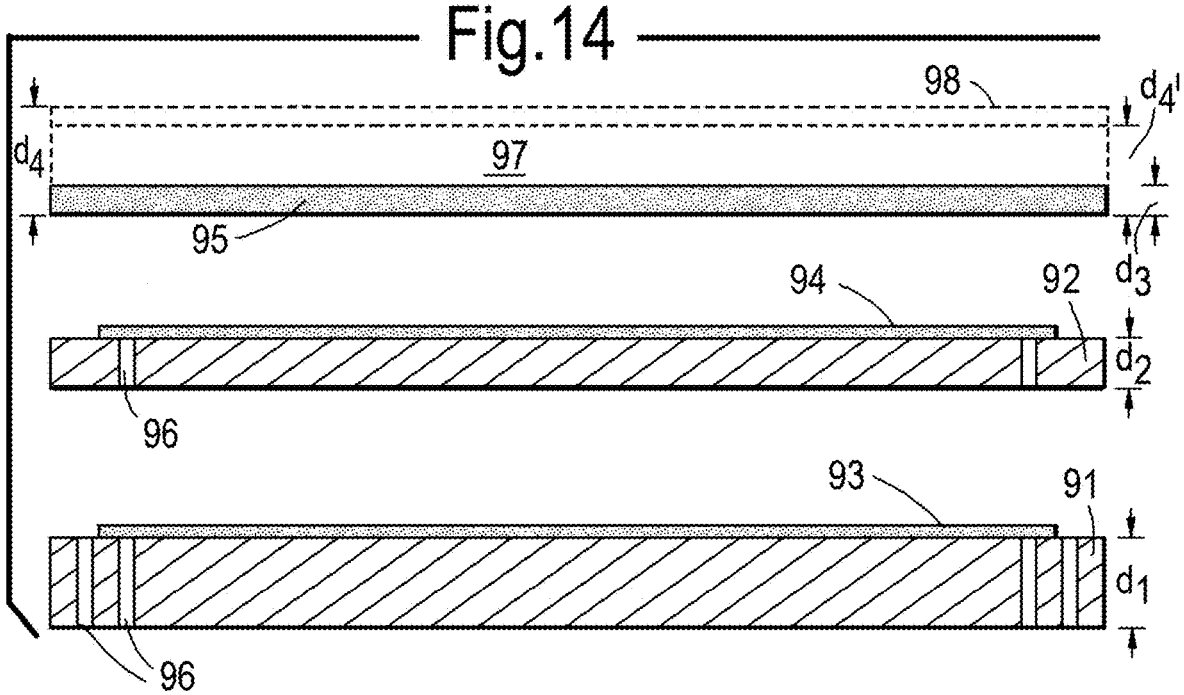

METHOD FOR MANUFACTURING LARGE CERAMIC CO-FIRED ARTICLES

CROSS-REFERENCE TO RELATED APPLICATIONS

This application is a continuation of U.S. Non-Provisional patent application Ser. No. 15/308,417, filed on Nov. 2, 2016, which application is the U.S. national phase entry of International Patent Application No. PCT/EP2015/060126, filed on May 7, 2015, which application is related to and claims priority benefits from U.S. Provisional Application No. 61/989,656, filed on May 7, 2014, entitled "METHOD FOR MANUFACTURING LARGE CO-FIRED ARTICLES," the entirety the each of which is incorporated herein by this reference.

FIELD OF THE INVENTION

The present invention relates to an improved high temperature co-fired ceramic (HTCC) processing method capable of producing large size multilayer ceramic devices. A typical application would be in the manufacture of wafer heating and electrostatic static chuck apparatus used in the manufacture of semiconductors.

BACKGROUND ART

Many fields of technology require large ceramic bodies having embedded electrical conductors. As a non-limitative example, in semiconductor manufacturing processes, a wafer heating or chucking apparatus may be used. In the processing of semiconductor wafers or displays, a substrate support is used to retain the substrate during a particular manufacturing process such as during chip manufacturing process. The substrate support is commonly known in the art as an electrostatic chuck (ESC) because it electrostatically clamps onto the substrate, e.g. semiconductor wafer during a manufacturing process such as in a physical vapour deposition (PVD), chemical vapour deposition (CVD) processing system and etching system. In the substrate processing equipment, the electrostatic chuck may be detachably secured to a pedestal within the process chamber that is capable of raising and lowering the height of the ESC and substrate. The temperature of the ESC can also be controlled to heat or cool the substrate material. Such apparatus is typically a disk-shaped part located inside the processing chambers of CVD, PVD, etch or hot ion-implant devices. ESC rely on the attraction of opposite charges to hold both the insulating and conducting substrates and typically include one or more electrodes embedded within a chuck body so as to create a top dielectric layer or semi-conductive material. The chuck body also comprises a second layer below the dielectric layer, also referred to as an insulating base and is typically made from an insulating material.

When a voltage is applied to the electrodes an electrostatic clamping field is generated across the dielectric layer. The gripping force between the substrate and the ESC is proportional to the dielectric properties of the dielectric layer, in particular to the thickness of the dielectric layer. Other influential factors include the gap size between the substrate and the ESC. Thus, it is essential in the manufacture of the ESC that the dimensions of the ESC, in particular to the thickness of the dielectric layer is not only made to very tight dimensional tolerances but also made substantially flat to maximize the contact surface area between the substrate and the clamping surface of the ESC. Since semiconductor wafers are manufactured to very tight tolerances, any warping or unevenness in the clamping surface of the ESC would be highly undesirable and in an extreme case could even damage the semiconductor wafers.

Other problems encountered in the manufacture of ESCs is the difference in thermal expansion coefficient between the ceramic insulating material and the metal electrodes resulting in stress and eventual cracking within the ESC body when the ESC is operated at high temperatures or thermal cycling. To overcome such differences in the thermal expansion, the ceramic insulating chuck may be made thicker to provide the necessary strength and prevent fracture during thermal cycling.

In recent years the size of Si wafer has increased from 200 to 300 mm, and use of 450 mm wafers is predicted in the market in the near future. As wafer size increases, the size of heater and electrostatic chuck to handle wafers also increases, and this larger size is a challenge to the manufacturing of wafer handling devices.

In recent years, hot ion-implantation has created more attention due to its advantage of defect free doping which increase the device performance (for example FinFET). However, high temperature heaters (e.g. to 600° C.) are needed for hot ion-implantation. Some of the current wafer heating and chucking apparatus, using glass or low temperature metal bonding, are not able to handle this high temperature requirement.

An improved heater and electrostatic chuck manufacturing method is needed to provide devices capable of meeting the high temperature requirements for hot ion-implantation; but the invention is of wider applicability.

U.S. Pat. No. 6,225,606 (Hideyoshi Tsuruta et al) describes a method of manufacturing heaters for wafer processing. Metal mesh made from materials such as Molybdenum (Mo) is often used as a heating element. The mesh is placed in a die and embedded in ceramic which fills the voids in the mesh in a hot pressing step. However, the cost of hot pressing is high in comparison with pressureless sintering methods; in addition, the pressure tends to break the metal mesh inside the die. Further provision of mesh conductor results in a perforated conductor that needs to be of broader width than an unperforated conductor of like current carrying cross sectional area need to be.

In addition, in the hot pressing method it is difficult to produce certain features such as hollow cooling channels or blind holes; therefore there is a need to develop a cost effective manufacturing method for wafer heating and chucking devices.

High temperature co-fired ceramic (HTCC) is a processing method conventionally used to produce small electronic packages and heaters. Co-fired ceramic devices are made by processing a number of layers (green tape) independently before assembling them into a device as a final step. Co-fired devices may comprise multilayers of ceramic (for example, alumina or aluminum nitride) with metallization of individual layers (for example with Tungsten or Molybdenum metallizations). Typically co-firing is used for smaller devices [e.g. up to 100 mm].

A problem that becomes evident in making wafer heaters and chucks is size. Green tape of ~600 mm in width would be needed to produce a device wide enough for handling a 450 mm wafer. Thick tape (>1 mm) is preferred to reduce the number of layers needed, since the device has fairly thick dimension; e.g. 9 mm and as a rule of thumb, the firing yield for HTCC devices decreases as the lateral size and number of layers increases.

In high temperature co-firing there are two major tape manufacturing methods used—the doctor blade method and the roll-compaction method.

In the doctor blade method a slurry of ceramic particles and other additives [e.g. binders, dispersants, plasticisers] in a solvent [which can be but is not necessarily water] is applied to a moving substrate, and as the substrate moves under the doctor blade the slurry spreads to form and coat a thin sheet over the substrate.

In the roll-compaction method a feedstock comprising ceramic powder and other additives [e.g. binders, dispersants, plasticisers] is forced through two counter-rotating rollers, and is compacted sufficiently to form an adherent tape.

Both methods have problems in producing large and thick tape.

The doctor blade method is difficult to use in producing thick tape due to the high binder and solvent content of the slurry which has to be removed in drying and firing. Commercial green tape rarely exceeds 1 mm in thickness and 300 mm in width.

The roll compaction method can produce thick tape but it is difficult to produce large sizes due to pressure limitation of the roller. In addition, roll compaction tape shows non-uniform shrinkage during sintering. For example, an alumina tape produced by roll-compaction can have a shrinkage factor of 1.15 along the rolling direction and 1.19 perpendicular to the rolling direction due to the pressure difference during roll compaction. Non-uniform shrinkage would be a major problem during the manufacturing of wafer handling devices, due to the precision dimensional control needed for wafer handling devices.

The present invention addresses these issues and introduces an improved HTCC processing method to produce large and thick multilayer ceramic devices, for example a heater and chuck.

SUMMARY OF INVENTION

The present invention in its broadest aspect consists of forming sheets by dry pressing powders of the sort conventionally used in roll compaction and using these sheets to form articles by HTCC processing to a precise thickness and density. The present invention provides a method of forming one or more high temperature co-fired ceramic articles, comprising the steps of:
  a) forming a plurality of green compacts, by a process comprising dry pressing a powder comprising ceramic and organic binder to form a green compact;
  b) disposing a conductor or conductor precursor to at least one surface of at least one of the plurality of green compacts to form at least one patterned green compact;
  c) assembling the at least one patterned green compact with one or more of the plurality of green compacts or patterned green compacts or both to form a laminated assembly;
  d) isostatically pressing the laminated assembly to form a pressed laminated assembly;
  e) firing the pressed laminated assembly at a temperature sufficient to sinter the ceramic layers together.

In comparison to roll compaction, dry pressing the ceramic powder formed by powder compaction on uniaxial presses provides more uniform shrinkage, thus making this technique suitable for manufacturing components that not only necessitate a high degree of dimensional tolerance but can be made to relatively large sizes or diameter, e.g. in the manufacture of electrostatic chucks. One example of dry pressing according to one embodiment of the present invention is uniaxial pressing or die pressing or iso-pressing or a combination thereof. Co-firing the laminated assembly provides seamless bonding between the plurality of green compact so creating a monolithic insulating ceramic body with one or more electrical conductors embedded therein.

Preferably, the step of disposing a conductor or conductor precursor comprises the step of applying a metallization layer to at least one surface of at least one of the plurality of green compacts to form the at least one patterned green compact. Other examples include applying a foil to at least one surface of the green compact or even a conductor precursor such as a printing ink composed of a metal precursor on the layers, e.g. ink jet printing, which subsequently converts to a metallic conductor during firing. Where a foil pattern or wires is deposited on the layers, the application of pressure embeds the foil within the green ceramic layer so as to effectively "mould" the green ceramic around the foil pattern. To create one more holes or gaps (pathways) in the fired article such as for the purpose of providing vias or access areas in the fired part for electrical connection to the conductor or metallization layer, preferably step c) further comprises positioning one or more shapes formed from a fugitive material between at least two of the green compacts, whether either or both is patterned or not; subsequent to step d) the fugitive material is removed to leave hollow channels within the article. This removes the need to punch or drill one or more holes in the green and/or fired part respectively and thereby, reducing the number of manufacturing steps in the fabrication of the part for use as an electrostatic chuck or heater. The use of a fugitive material to retain internal voids in the fired ceramic part also provides pathways or channels for fluid such as air or liquid. In the case, where ESC requires cooling of the substrate at least one heat transfer fluid loop can be created within the fired ceramic part so as to generate a heat sink preventing overheating of the substrate.

Since the size or diameter of the semiconductor wafer (e.g. silicon) has increased over the years, there is an increasing need for an electrostatic chuck to accommodate the increasing size of the semiconductor wafer. By the manufacturing process of the present invention, preferably, the fired article have at least one orthogonal X and Y dimension greater than 200 mm and an orthogonal dimension Z less than the X and Y dimensions. More preferably, both orthogonal X and Y dimension are greater than 200 mm. In the manufacture of the dry pressed green compact, optionally the powder is a spray dried powder.

Preferably, according to one embodiment of the present invention, the one or more high temperature co-fired ceramic articles can be used in the manufacture of heaters whereby the conductors function as electrical heating elements. More preferably and/or in combination with a heater, the high temperature co-fired ceramic articles can be used in the manufacture of an electrostatic chuck; said electrostatic chuck comprising;
  an insulating base;
  a one or more electrically conductive electrodes disposed on said insulating base; and
  a dielectric top layer, having a top surface and an opposite bottom surface, such that said electrodes are disposed between said insulating base and said dielectric top layer.

Once fired, the assembly of the one or more plurality of green compacts or patterned green compacts defines the insulating base. In order to create a sufficient electrostatic force to retain one or more semiconductor wafers without producing a short circuit, it is paramount that the substrate support forming the dielectric layer is made sufficiently thin to interact with one or more electrodes beneath so as to generate an adequate electrostatic field on the substrate surface. The dielectric layer is formed from a second insulating material laminated to the insulating base to prevent a short circuit. Preferably, the dielectric layer has a thickness of substantially less than 1 mm or less than 0.5 mm or less than 0.25 mm, or less than 0.1 mm. As it is necessary that the thickness of the dielectric layer is thin, in one embodiment of the present invention, the dielectric layer is optionally fabricated form a tape cast material. Preferably, to provide uniformity in terms of shrinkage between the dielectric layer and the insulating base particularly during debinding and/or firing, preferably the dielectric layer is composed of the same green compact forming the insulating base. Fabricating the ESC from layers formed by different processes (e.g. tape casting), in particular the dielectric layer, runs the risk of differential shrinkage between the dielectric layer and the remainder of the insulating ceramic body during debinding or firing which could be due to their different binder content, different internal stresses through their particular fabrication process, leading to possible delamination of the dielectric layer from the rest of the insulating body. By fabricating the dielectric layer from the same processing technique and material as the insulating base, e.g. green compact, removes this differential shrinkage leading to a more homogenous fired part. To achieve the necessary thinness of the dielectric layer, once fired one face of the fired (monolithic) part is machined down to the required thickness necessary to interact with the metallization forming the electrodes embedded therein to create an electrostatic field when a voltage is applied to the electrodes.

In some applications of the electrostatic chuck, it is necessary to control the temperature of the substrate. Preferably, the insulating base comprises a heater, more preferably the heater comprises one or more electrical conductors forming electrical heating elements embedded therein.

In an alternative embodiment of the present invention, the high temperature co-fired ceramic article is a heater comprising an insulating ceramic body with one or more conductors forming electrical heating elements embedded therein.

When the fired laminated assembly is used as an electrostatic chuck, the exterior surface or face of the co-fired ceramic part would need to be substantially flat so as to ensure that there is maximum surface area contact between the substrate wafer and the support surface of the dielectric layer. In order to provide the flatness of the co-fired ceramic part, the present invention provides a method of flat firing an article comprising the steps of;

a. supporting the article on an insulating setter having at least one substantially flat surface;

b. mounting or assembling an insulating weight having at least one substantially flat surface on the article such that the article lies between the substantially flat surface of the insulating setter and the insulating weight.

Steps (a) and (b) are then fired to the sintering temperature in hydrogen as discussed above. Preferably, the at least one surface of the setter and/or weight adjacent the article are machined substantially flat. By machining at least one face of the setter and/or the weight that is in contact with the green article substantially flat, the green article will either maintain its flatness or take up the flatness of the surface of the setter and/or weight during firing. For example, in the latter case, where the green article, as a result of its forming process such as dry pressing or iso-pressing or even handling is not perfectly flat or has imperfections, by firing the green article between substantially flat surfaces of the setter and the weight, the pressure applied by the weight causes the article to substantially take up the flatness of the flat surfaces of the setter and/or weight. Moreover, the pressure applied by the weight allows the green ceramic layers to form around or "mould" around the deposited conductor or metallization layer during firing and densification so as to create a seamless interface between the green ceramic compact and the patterned green compact. Preferably, the setter and/or weight comprises alumina.

Further details and features of the invention will be apparent from the attached claims and following description made with reference to the accompany drawings in which.

FIG. 3 illustrates the flow chart for manufacturing of 300 mm diameter heater or ESC for wafer processing;

Figure 6A:
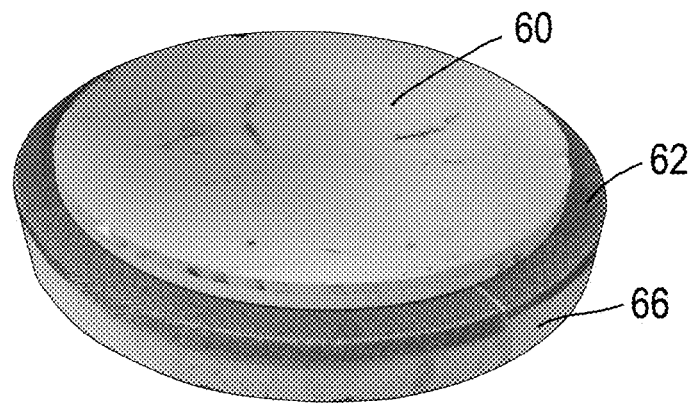
Figure 6B:
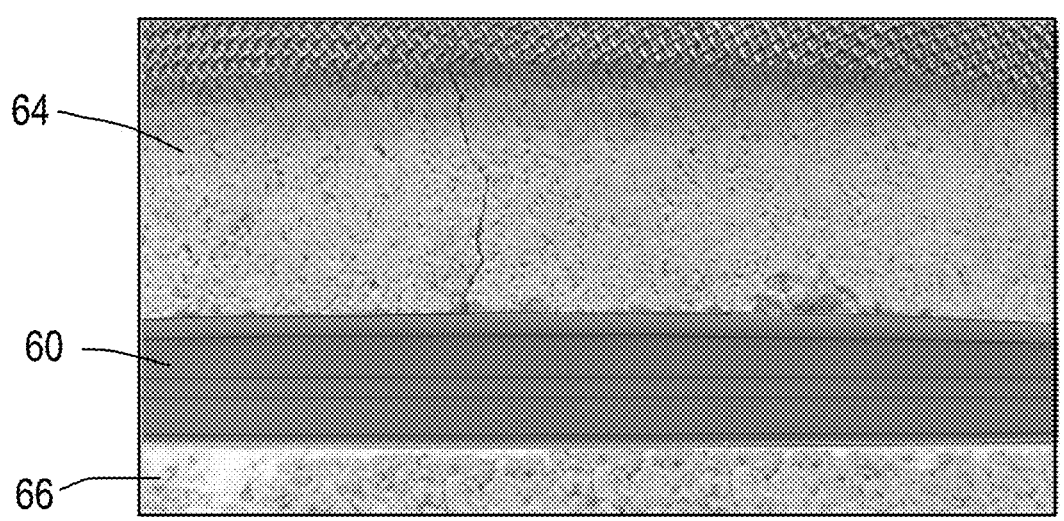

FIG. 6(a) showing the assembly of dry pressed green sheets placed on a Molybdenum screen during debinding/binder burn-out of the assembly;

FIG. 6(b) shows the flat firing process of the green laminated assembly between a setter and weight.

Figure 6C:
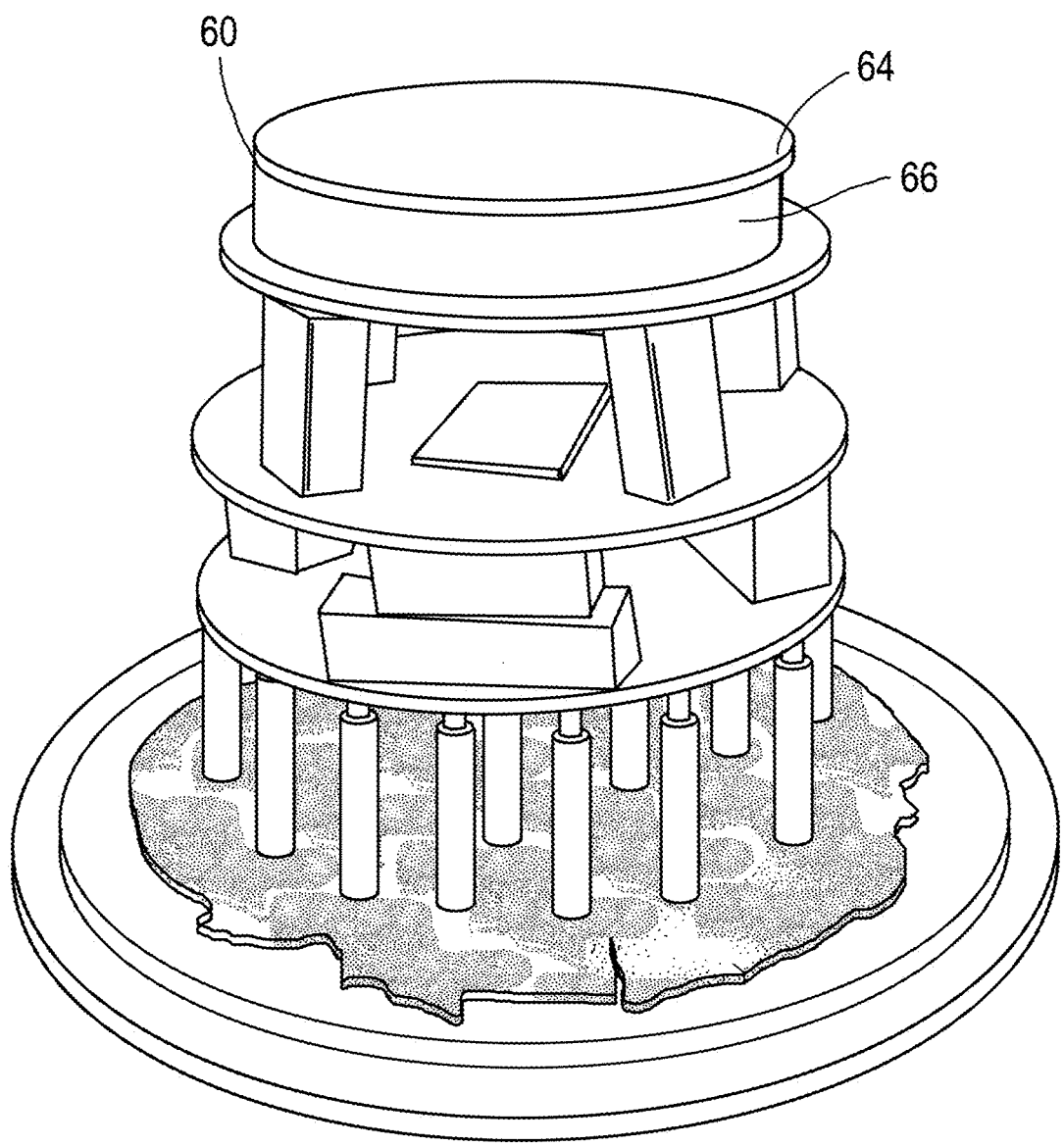

FIG. 6(c) showing the set-up for firing of the dry pressed green ceramic sheets in a wet hydrogen furnace.

Figure 7:
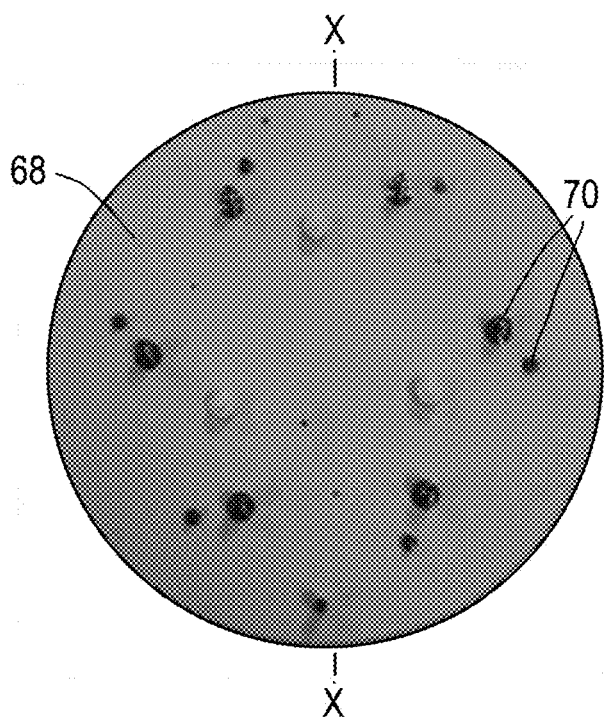
Figure 8:
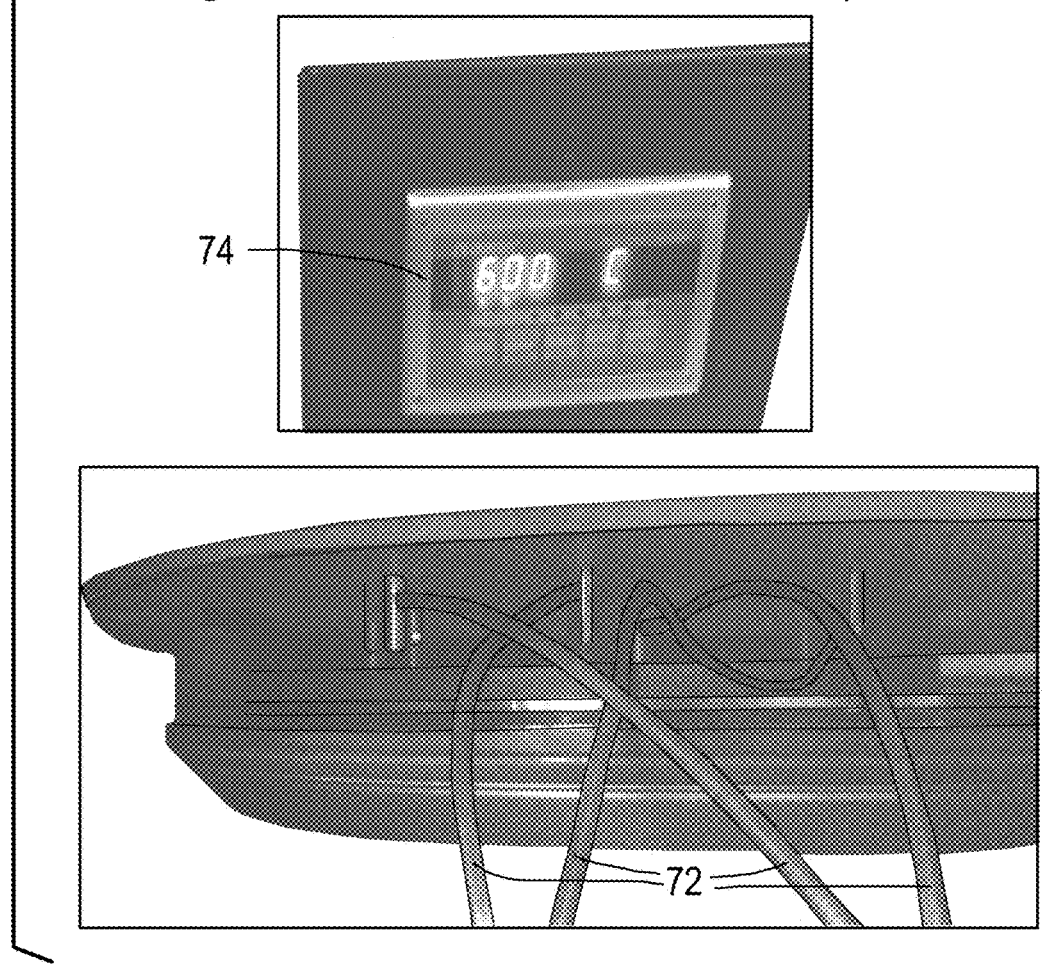

FIG. 7 shows the presence of brazed supporting fixtures (e.g. mounting pin) and electrical feedthroughs to the underside of the fired part;

FIG. 8 shows the testing of the heater in a vacuum chamber using thermocouples attached to the heater and demonstrating a reached temperature of 600° C.

Figure 9:
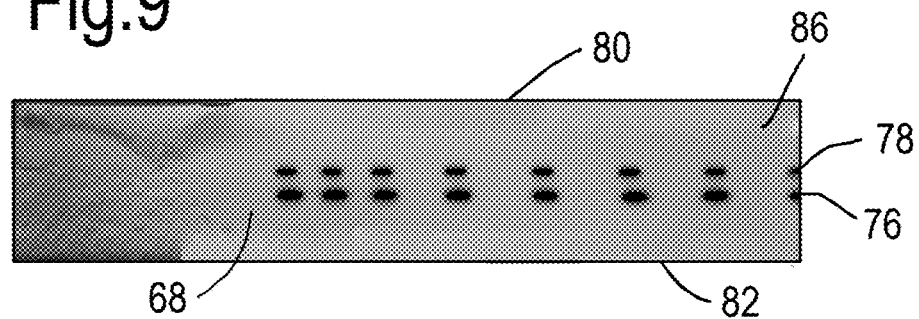
Figure 10:
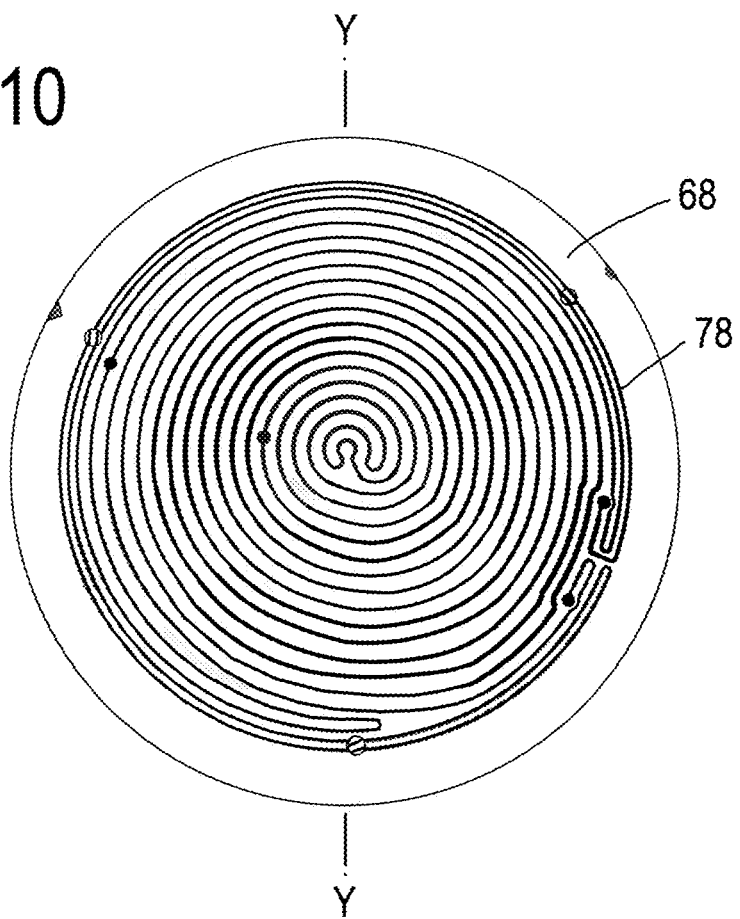
Figure 11:
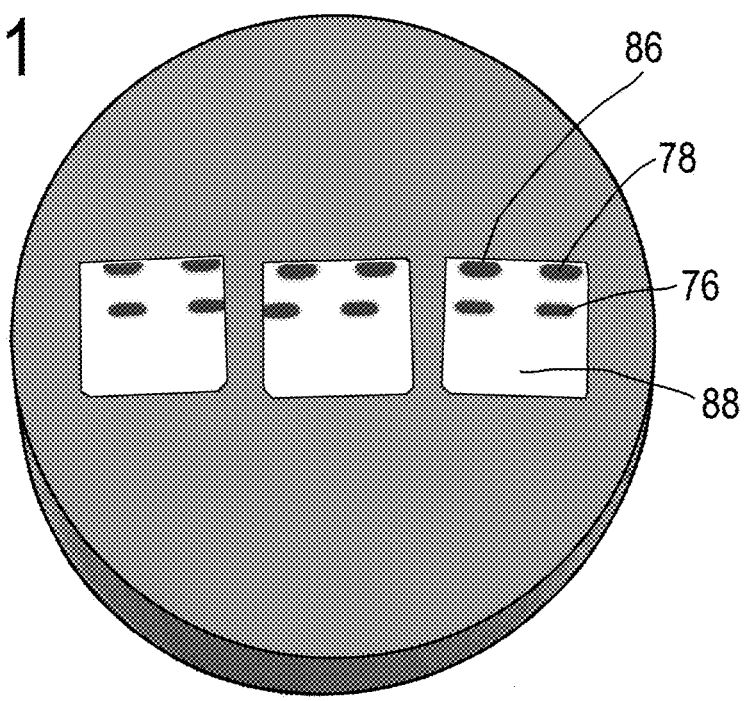
Figure 12:
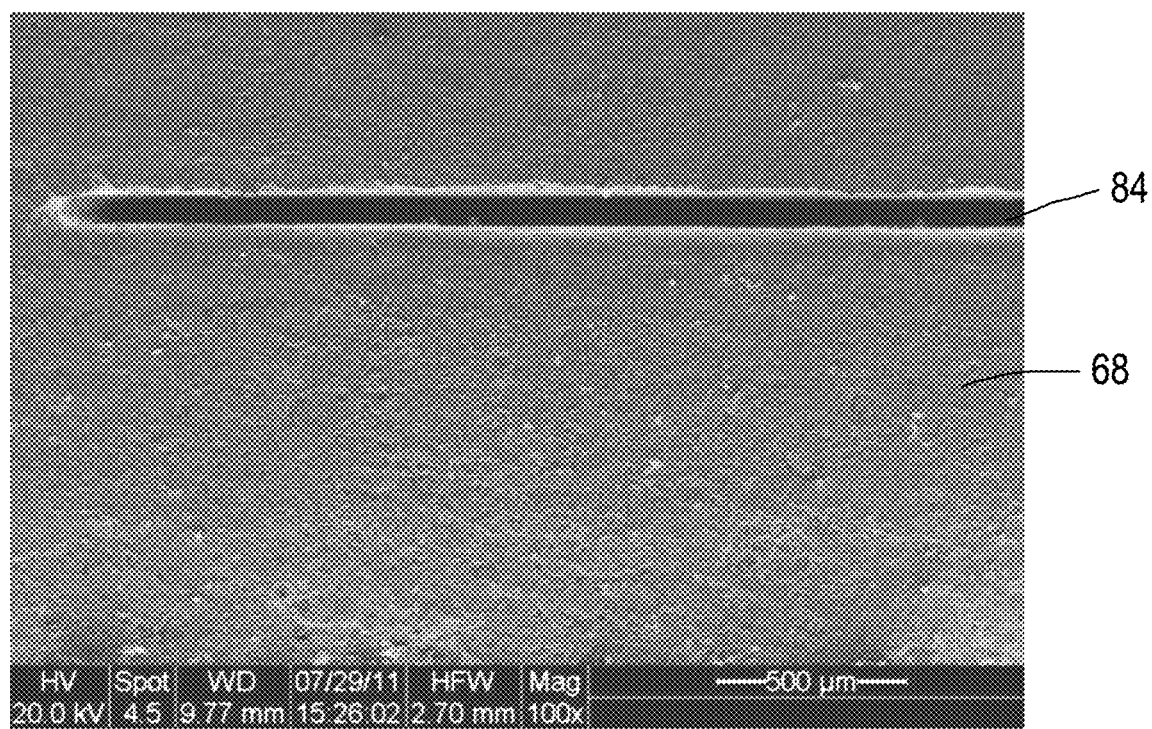

FIG. 9 shows a cross-section along the line X-X of the fired part shown in FIG. 7;

FIG. 10 shows the top face of the ground flat fired part forming the ESC;

FIG. 11 shows a cross-section of the part along the line Y-Y of the ground flat fired part shown in FIG. 10;

FIG. 12 showing a void formation in the fired part;

FIG. 13 is a schematic illustration of the heater/ESC apparatus using a tape cast material as the dielectric layer.

FIG. 14 is a schematic illustration of the heater/ESC apparatus based on three dry pressed ceramic compacts.

DETAILED DESCRIPTION

It is known that the roll compaction process for tape formation starts with spray drying of ceramic powder with organic binder, followed by feeding the ceramic powder into a roller to produce thin tapes. The pressing of powder between two rollers results in tape with non-uniform shrinkage in the XY direction. The present invention addresses these issues by using dry pressing method to produce thin sheets. Examples of a dry pressing technique include but are not limited to uniaxial pressing, die pressing, isopressing or a combination thereof. To maintain flexibility and lamination properties of the thin sheets and for the purpose of illustration of one example of the present invention, ceramic powders with organic additives similar to those commonly used in the roll compaction tape formation process are used as the raw material for the dry pressing tape.

Depending on the die size of dry presses, green sheets of large diameter (e.g. up to 1 m or more), thickness in the range from 1 mm up to 50 mm can be produced (as can sheets of thickness less than 1 mm). Such dry pressed sheet has good flexibility and is capable of receiving metallization paint that is screen printed or otherwise applied (e.g. ink jet printing, spray coating, spin coating, dip coating, numerically controlled dispensing) to produce large and thick HTCC devices.

Similar to standard tape processing, mechanical punch, waterjet, laser or other means can be used to shape layers and produce via holes in the green sheets.

After applying metallization paint, isostatic pressing is used to assemble multiple layers of green tapes and/or dry pressed green sheets. Typical pressures are up to about 103 MPa (15 k psi) but higher pressure may be used as required. Isostatic pressing not only produces good lamination between tapes but also ensures a uniform shrinkage of the multilayer tape structure during firing.

To demonstrate the feasibility of the current invention, a batch of 99.5% alumina powder was mixed with other inorganics, binder, plasticizer, dispersant and water to form a slurry, and subsequently spray dried to form a powder comprising the inorganics, binder, plasticizer, and dispersant.

The composition of the inorganic components of the spray dried powder is listed in Table 1. The alumina powder used was A152 SG from Almatis, Inc, which, form their data sheet, has an average particle size of ~1.2 µm and surface area of ~4.3 m$^2$/g.

TABLE 1

|  | Al$_2$O$_3$ | Magnesium carbonate | EPK Kaolin |
|---|---|---|---|
| Wt percent | 99.2% | 0.5% | 0.3% |

The binder can be any suitable material that provides adequate adhesion between the inorganic components after dry pressing to give an adherent yet flexible sheet. Typical binders include, for example, acrylic latexes, PVA, alkyd resins, polyethylene glycol, poly(methyl methacrylate), polyvinyl butyral, polyethyl oxazoline, polyacrylates, polyvinyl pyrolidone, cellulose, polyethylene, paraffin, and many more.

The plasticizer can be any suitable material that assists plastic deformation of the material. This is useful both during the dry pressing stage, and during the isostatic pressing (lamination) stage. Suitable materials include, for example, glycols, polyethylene glycols, mineral oil, phthalates, esters, benzyl butyl phthalate, polymers similar to the binder used but of lower molecular weight, and many more.

The dispersant is useful in ensuring that the slurry is well dispersed prior to spray drying so that the spray dried powder has good homogeneity. Typical dispersants include, for example, ammonium polyacrylate, ammonium citrate, fatty acids, corn oil, fish oil, amines, polyesters, polyamines, pH control substances (for example HCl or NH$_4$OH), and many more.

Choice of binder, plasticizer (if any), and dispersant (if any) depends in part on their mutual compatibility achieving desired properties in a green compact and their behavior in a slurry, if spray drying is the route used to form the powder.

Typically, the inorganic components comprise over 50% by weight of the slurry, for example about 68%. Typical slurry formulations might be:

TABLE 2

|  | Wt % in slurry | |
|---|---|---|
| Material | Formulation 1 | Formulation 2 |
| Inorganics | 68.2% | 68.2% |
| Water | 24.0% | 28.4% |
| Dispersant | 1.1% | 0.9% |
| Acrylic binder | 0% | 1.5% |
| PVA binder | 5.5% | 0% |
| Plasticiser (polyethylene glycol) | 1.2% | 0.9% |

After spray drying, a portion of the spray dry powder was used to generate roll compaction tape. The remaining spray dry powder from the same batch was used to generate dry pressed sheets. The properties of a laminated body formed from roll compacted tape and dry pressed sheet is listed in Table 3.

TABLE 3

|  | Roll compaction tape | Dry pressed sheet |
|---|---|---|
| Shrinkage factor* of tape in the XY direction after about 103 MPa (15 kpsi) isostatic pressing and 1600° C. sintering | 1.14 × 1.17 | 1.17 × 1.17 |
| Density# of tape/sheet after isostatic pressing and sintering | 3.9 g/cc | 3.9 g/cc |

*Shrinkage factor = XY dimensions of green part divided by same dimension of sintered part
Measured by water replacement (Archimedes).

From the above data, it is clear that the dry pressed sheets has more uniform shrinkage than that of the roll compaction tape. Both approaches have achieved nearly full density of the sintered alumina body, but the superior uniformity of shrinkage of the dry pressed sheet means that features may be positioned precisely in the body formed from dry pressed sheet. While it is not required that the green ceramic starting layer be "tape" as typically used in HTCC (High Temperature Co-Fired Ceramic) processing, typical tape processing can be used for this invention.

The improved HTCC processing method can be used to not only produce large size wafer processing apparatus for use in a ESC but also can be used to produce a multiplayer heater. The following examples are used to demonstrate the versatility of the improved HTCC processing method:

Example 1

A multilayer heater is produced using the improved HTCC method as a demonstration of feasibility on a small scale.

Figure 1:
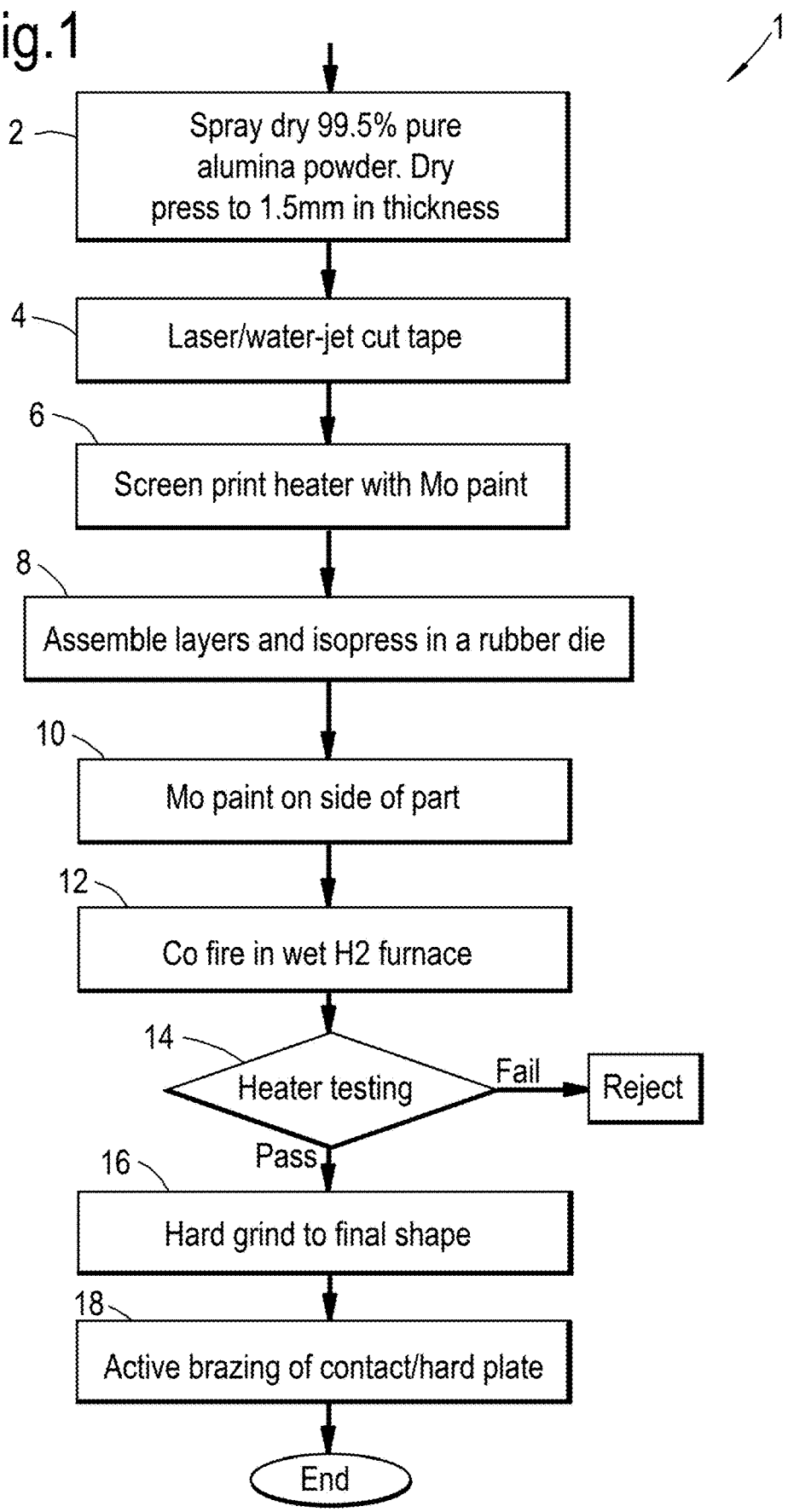
FIG. 1 illustrates the processing flow chart of the manufacturing process to produce the four layer heater generated by dry pressing method.

FIG. 1 illustrates the processing flow chart 1 for manufacturing of a four layer heater.

The process shown uses the spray dried 99.5% pure alumina powder mentioned previously. It should be noted that the present invention is not restricted to 99.5% alumina and can be used for other ceramics, [e.g. alumina of different purity (for example 90-99.9%), ZrO2, Y$_2$O$_3$, AlN, Si$_3$N$_4$, SiC, or indeed any ceramic].

At step 2, the spray dry powder is pressed (or uniaxially pressed) in a 2" die to produce thin sheets of about 1.5 mm thickness from the spray dried powder. The dry pressed green sheets is then cut in the green state to the desired shape (Step 4), e.g. by laser or water jet cutting.

Following cutting of the green sheets, the shaped dry pressed green sheets are metallized to deposit a metallization layer or metallic precursor on its surface (Step 6). In the particular embodiment, metallization involves screen printing, but other metallization techniques are permissible in the present invention, e.g. ink jet printing, spraying etc. The use of a metallic precursor enables techniques such as ink printing to be used. Although a Mo (molybdenum) based metallization is used in the particular embodiment, other conductive material can be used such as conductive material selected from the group consisting of platinum, palladium, gold, tungsten, molybdenum, niobium, tantalum and alloys of any of the foregoing. After screen printing the dry pressed green sheets with Mo based metallization (Wesgo 538 paint) measures approximately 25 μm in thickness (which after firing leads to a metal thickness of ~20 μm; four layers of the dry pressed green sheets are laminated together using a rubber die in an isostatic press at a pressure of 103 MPa (15 kpsi) (Step 8). Also shown in FIG. 1 is the application of a conductive Mo paint to the side or end of the laminated green sheets (Step 10). Step 10 can optionally be performed after the laminated assembly is co-fired.

After lamination, the pressed assembly of green sheets is sintered or co-fired in an Astro™ furnace using wet $H_2$ gas to ~1600° C. at a pressure of 1 atm (Step 12) to form a monolithic insulating ceramic body having one or more electrical conductors embedded therein.

After sintering, the four layer 20 heater is ground to the final shape (Step 16). Prior to machining the fired assembly, the assembly can optionally be tested at this stage (Step 14) to test the performance of the co-fired assembly as a heater 20. Electric contacts are made with the metallization layers, e.g. by means of vias, and an electric current is passed through the metallization layers to test the heating performance of the heater. In the particular embodiment, electrodes 24 (See FIG. 2) are brazed to the exterior surface of the assembly to electrically connect each of the metallized layers. The side of the heater is then brazed using active brazing alloy (Cusil® ABA™) as contact (Step 18).

A kovar hard plate 26 is brazed on top of the heater using a lower temperature braze alloy (Incusil®).

Figure 2:
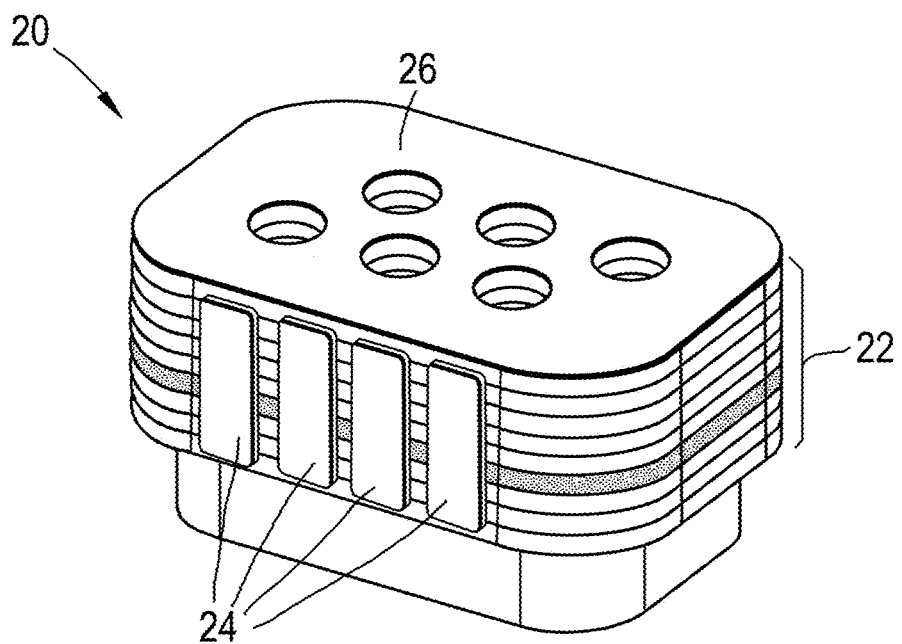
FIG. 2 illustrates the four layer heater after hard grinding and brazing of hard plate.

FIG. 2 shows the final shape of the brazed heater assembly 20 showing a laminated assembly of layers 22 of the fired dry pressed green compact with printed heating pattern. Testing of the heater using a power supply suggested good reliability of heater.

Example 2

The objective of the example is to demonstrate the new HTCC processing method can be used to produce large sized wafer processing apparatus such as heater and electrostatic chuck (ESC) combination or electrostatic chuck (ESC). The goal is to ensure the 300 mm heater is capable of thermal cycling between room temperature and 600° C. with good temperature uniformity.

FIG. 3 illustrates the flowchart of the manufacturing process 30. Similar to example 1, the manufacturing process for a 300 mm wafer heating device starts with spray drying of 99.5% pure alumina powder using the alumina powder (Step 32) as mentioned previously.

Figure 4A:
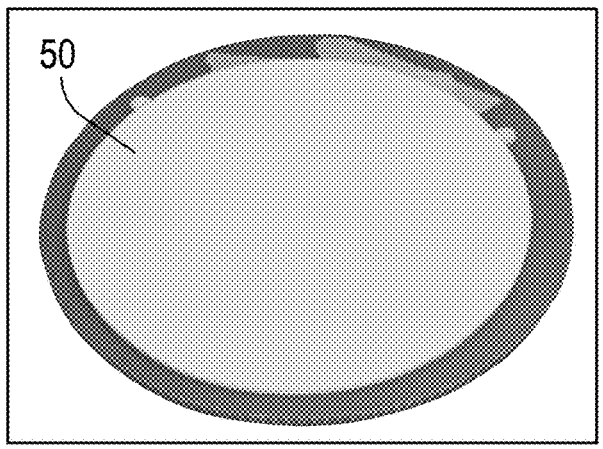
FIGS. 4(a and b) shows layers of the dry pressed green ceramic sheets with via holes drilled and screen printed with Mo based heater pattern and (b) shows a magnified view of dry pressed green ceramic sheet with metalized layer and alignment hole.

The spray dried powder is dry pressed using a 2500 ton dry press (uniaxial press) with an 81 cm diameter die to generate green sheets of 81 cm diameter with thickness in the range of about 2.5 mm to 6 mm (Step 34). In the particular embodiment where the ESC is used in combination with a heater, the combination may be based on assembling three dry pressed sheets formed from two outside dry pressed sheets and a centre dry pressed sheet. The two outside pressed sheets has a thickness of about 5 mm or 6 mm and the centre dry pressed sheet has a thickness of about 2.5 mm. Further detail of the arrangement of the dry pressed sheets is discussed below with reference to FIG. 14. FIG. 4(a) shows an example of a dry pressed green ceramic sheet 50 according to an embodiment of the present invention.

Figure 4B:
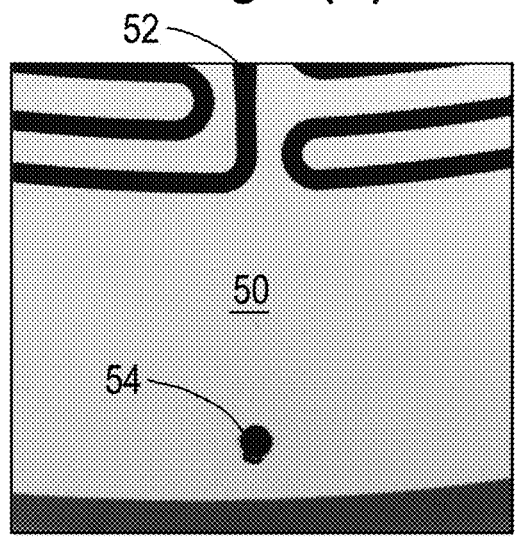
Figure 5A:
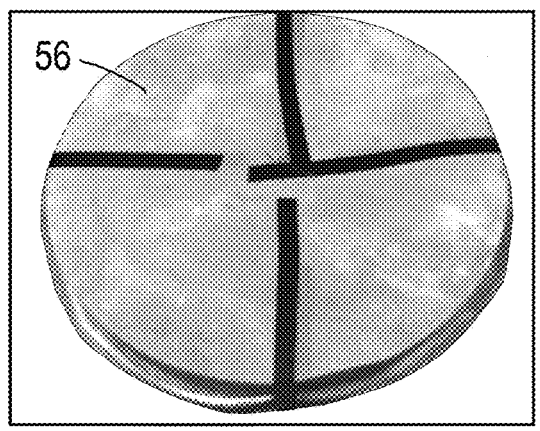
FIGS. 5(a and b) shows the lamination process for dry pressed thin plates to form an assembly of the dry pressed plates; (a) shows the assembly of dry pressed green ceramic sheets sandwiched between rubber pads; (b) placed inside the vacuum isopress bag.
Figure 5B:
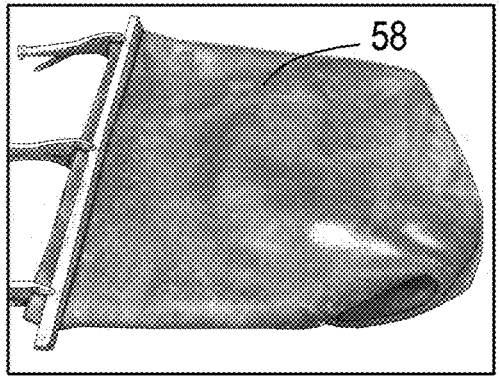

The dry pressed green sheet is then water jet cut to a 30 cm diameter with alignment holes (some or all of which may serve as lift pin holes in the finished heater) (Step 36) as demonstrated in FIG. 4. Holes 54 (see FIG. 4b) in the dry green sheet also serve as vias that extend from the metallization layer to at least one exterior face of the dry pressed green sheet in order to provide electrical connection with the metallization layer. The vias and holes are filled with wax or other fugitive material (or other fugitive material that can be removed in later processing—see FIG. 4(b)), so that during pressing they do not close. Electrode and/or heater patterns is/are screen printed (Step 38) onto one or more dry pressed green sheets depending on whether the part is being fabricated as an ESC part only or a ESC/heater combination. FIG. 4(b) shows a magnified portion of the patterned dry pressed green sheet with metalized layer 52. In the case where the part is being fabricated as an ESC only, an electrostatic chuck electrode pattern is screen printed onto the surface of a dry pressed green sheet. However, in the case where the part is fabricated as an ESC and heater combination, one outside dry pressed sheet is screen printed with a heater pattern and another centre dry pressed sheet is screen printed with an electrostatic chuck electrode pattern. After screen printing the dry pressed green sheet(s) with Mo based paint (Wesgo®538 paint, thickness ~25 μm) is/are aligned with the two or more layers of dry pressed green sheet, before vacuum bagged together with a support plate (described below) and laminated together using an isostatic press at a pressure of about 103 MPa (15 kpsi) (Step 40) (FIG. 5). In the particular embodiment of the present invention as shown in FIG. 5, the aligned dry pressed sheets are sandwiched between rubber pads 56 (FIG. 5a) and then placed inside a vacuum isopress bag 58 (see FIG. 5b). The support plate is a plate that provides sufficient rigidity so that the aligned dry press green sheets do not distort and remain flat during the pressing process. A typical material for the support plate might be aluminum or alumina plate whereby one surface (support surface) of the alumina plate has been ground flat, but other materials may suffice.

The laminated and isostatically pressed part 60 is placed over Mo and alumina setters 66 and sintered in an Astro™ hydrogen furnace in a wet hydrogen atmosphere to 1600° C. at a pressure of 1 atm (FIG. 6c) to form a monolithic ceramic to metal composite (Step 42). It is paramount in the application of an electrostatic chuck that the outer or exterior faces or surfaces of the co-fired ceramic part, in particular the support surface of the dielectric layer, remains substantially flat after firing, otherwise any distortion introduced in the fired article could cause indentation to the substrate or semiconductor wafer. Moreover, the flatness of the support surface of the dielectric layer ensures maximum surface area contact between the semiconductor wafer and the support surface of the dielectric layer. To maintain the flatness of the fired part or assembly, the dry pressed green laminated assembly 60 is sandwiched or lies between an alumina setter 66 and a weight 64 during firing—see FIG. 6(b). Like the setters, the weight can also be composed of alumina so as to ensure that there is no cross contamination between the weight and/or setter and the laminated assembly. To ensure that the green laminated assembly or part remain flat during firing and to make sure that the surface of the setter or weight adjacent the assembly do not introduce any imperfections to the final co-fired article, at least one of the surfaces or faces of the setter and/or weight in contact with or adjacent the green laminated assembly are machined (ground) flat and possibly, polished flat (see FIG. 6b). The weight applies sufficient pressure onto the green laminated assembly to ensure a flat firing process. Further advantages of the weight include preventing delamination of the different layers of the green compact assembly during binder burnout and/or firing. Such a flat firing process discussed above ensures that any distortions in the green laminated assembly as a result of iso-pressing or even handling is removed since the exterior face or surfaces of the laminated assembly takes on the shape or flatness of the setter below and the weight above during firing.

The firing regime (Step 42) can comprises a slow binder burn out phase, in which the temperature is raised at a rate of 1° C. per minute up to a temperature sufficient to burn off the binder (typically, 275 to 400° C.) followed by ramping up at a rate of about 3° C./minute up to the sintering temperature (typically 1500° C. to 1600° C.) in hydrogen. After 2-3 hours at temperature, the temperature is ramped down (e.g. at a rate of 3° C./minute) to a temperature low enough to remove the sintered parts.

Carrying out binder burn off and sintering in the same furnace provides a one step process, as well as the ability to process multiple samples simultaneously in the furnace are advantageous over the complexity of hot pressing. However, alternative processes can be adopted, for example conducting the binder burn off and sintering steps in separate furnaces. In some cases, it is advantageous to treat the laminated and isostatically pressed part 60 in separate oven/furnaces because the conditions for debinding and/or binder burn out can be different to firing. For example, for debinding/binder burn off it is important that any volatiles generated during binder burnout do not introduce any defects or flaws in the pressed part, and as a result the set up for binder burn out is different to firing. For binder burn out it is necessary to ensure that there is adequate exposure of the entire exterior surface area of the dry pressed sheets for binder removal, since the volatiles generated during binder burnout would need to escape and be purged. However, since there is limited exposure to the underside of the dry pressed part as it is resting on the setter 66, a spacer is used to elevate the dry pressed sheet above the setter. This ensures that there is sufficient air flow to the underside of the laminated part to promote binder removal (pyrolysis of the binder). In the particular embodiment shown in FIG. 6a, the dry pressed ceramic part 60 is spaced apart from the setter 66 by resting on a Mo screen 62. Such a spacer is not necessary for firing since a majority of all of the volatiles have been removed through the previous binder burnout stage, and the green part can simply be placed directly on the setter to ensure flatness during firing by the flat firing process as discussed above in relation to Step 42. In some cases, in order to facilitate appropriate materials and applications of binder burn off, the process may be conducted by placing the laminated and isostatically pressed part in a bed of ceramic powder so that the powder "wicks" the binder out of the part.

In the firing process the wax filling the holes melts away leaving access points or vias for electrical connection to the metallization layer(s) and/or location points for locating the electrostatic chuck on a pedestal in substrate processing.

After densification, the fired parts 68 are hard ground (typically by Blanchard grinding) to the final dimension (Step 44) with an optional gas groove and various lift-pin holes (through holes for wafer ejection).

Subsequently, mounting pin and electrical feedthroughs 70 are brazed onto the heater/ESC plate using a high temperature braze (FIG. 7) such as Cusil® ABA™ as mentioned above) (Step 46). FIG. 7 shows the underside of the fired part 68 and shows the brazed supporting or mounting fixtures 70.

Co-firing the laminated assembly generates a monolithic insulating ceramic body comprising one or more layers of electrical conductors provided by the metallization layers embedded therein. FIG. 9 shows a cross-section of the fired monolithic ceramic body 68 comprising two metallization layers according to one embodiment of the present invention. The lower metallization layer 76 functions as a heater when connected to an electrical supply and the top metallization layer 78 functions as the electrostatic chuck electrodes which cooperates with a top dielectric layer to generate an electrostatic field. FIG. 9 additionally demonstrates the flatness of the top 80 and bottom 82 faces of the insulating ceramic body 68. Also demonstrated in FIG. 9 is the seamless bonding between the different green, dry pressed ceramic compact layers and the migration of the ceramic between the conductors in each metallized layer to produce a monolithic insulting ceramic body having two layers of electrical conductors embedded therein, e.g. the alumina is homogenous throughout the insulating body.

In the embodiment, where the ESC is located on top of a heater as shown in FIG. 9, the heating performance of said heater can be tested using the apparatus as shown in FIG. 8. The heater is placed in a vacuum chamber and attached to a power supply to test the performance of the heater (Step 48) using thermocouples 72 placed at different points on the fired laminated part. Heating up to 600° C. with good thermal uniformity is demonstrated by the temperature display 74 as shown in FIG. 8.

Additional Operations

Void Formation

Providing wax (or otherwise) filled holes as described above permits the optional formation of channels running across the thickness of the article. For example, where cooling is required to the electrostatic chuck, one or more channels or voids can be incorporated into the insulating ceramic body. To produce hollow channels 84 within the thickness of an article made by this method, it is possible to press shapes formed from a fugitive material between the layers of dry pressed sheet and subsequently burn off or otherwise remove the fugitive material.

Materials that can be used include wax, plastics, paper or flexible graphite, (e.g. Grafoil™).

FIG. 12 shows a section of ceramic having a void or channel 84 formed in this manner in which flexible graphite/paper shapes were placed between layers, and after isostatic pressing removed by oxidation in air or wet hydrogen firing process.

Such hollow channels can be used for a variety of purposes including: to provide gas supply or extraction channels; for filling with materials [e.g. metals to provide large conductors]; or even providing channels for the flow of a heat transfer fluid for cooling purposes.

Dielectric Layer

To generate an electrostatic force across the surface of the electrostatic chuck, the thickness of the ceramic layer forming the dielectric layer has to be sufficiently flat and thin to within acceptable tolerances so as to cooperate with the underlying electrodes.

While dry pressing is an excellent way of forming sheets, even of thickness as low as, for example, 0.25 mm, the thinner the sheet the more problematic is its formation.

When it is desired to provide just a thin surface layer [e.g. less than 1 mm, less than 0.5 mm, less than 0.25 mm, or less than 0.1 mm] for the dielectric layer then laminating a layer of tape cast material over a thicker dry pressed sheet can optionally be used with advantage. This is particularly so when the layer of tape cast is less than, for example, half the thickness of the dry pressed sheet or less than a quarter the thickness of the dry pressed sheet, or less than a tenth the thickness of the dry pressed sheet. In such an arrangement the uniformity of shrinkage of the dry pressed sheet can dominate, or even suppress the lack of uniformity of shrinkage of the tape cast material.

Such a process can be used to form an electrostatic chuck on top of the heater described in Example 2. For example (as indicated in FIG. 13):

1. two dry pressed green sheets 91, 92 (e.g. each of approximately 1 mm or 2.5 mm or 6 mm thickness) may have Mo based paint (Wesgo®538 paint, thickness ~25 μm) to define a heater pattern 93 on one dry pressed green sheet 91 and an electrostatic chuck pattern 94 on the other dry pressed green sheet 92. In the particular embodiment, one of the green dry pressed sheet has a thickness $d_1$ of about 6 mm and represents the outside sheet 91 or layer and another dry pressed sheet has a thickness $d_2$ of about 2.5 mm and represented the centre sheet 92.
2. The two layers of dry pressed green sheets may be aligned with a further, thinner $d_3$ (e.g. 0.1 mm thick), a dielectric layer 95 in the form of a tape cast layer so that the heater pattern 93 lies between the two dry pressed sheets 91, 92 and the electrostatic chuck pattern 94 lies between the dry pressed green sheet 92 and the tape cast layer 95; suitable holes or vias 96 in layers 91 and 92 can be provided for subsequent forming of feedthroughs to the electrostatic chuck pattern and heater pattern.
3. The assembly of two layers of dry pressed green sheet and tape cast layer can then be vacuum bagged together with a support plate and laminated together using an isostatic press in the same manner as described above.

In the case where the dry pressed green sheet has a thickness of approximately 6 mm, after firing the fired dry pressed sheet shrinks to a thickness, $d_1'$, of approximately 5 mm. For the 2.5 mm thickness green dry pressed sheet, after firing the dry pressed sheet shrinks to a thickness, $d_2'$ of approximately 2 mm. Likewise, after firing the thickness of the green tape cast layer shrinks to a smaller thickness, $d_3'$. In this process, the tape cast layer functions as the dielectric layer and is an outermost layer of the assembly, but for other applications the tape cast layer may lie within the assembly, e.g. between two dry pressed sheets.

Although the tape cast layer is advantageous in producing thin layers which is ideal as a dielectric layer since the tape cast layer is fabricated through a different process to a dry pressing process (e.g. uniaxial die pressing), differential shrinkage can result between the tape cast layer and the dry pressed layers during de-binding and/or firing. This could be due to a combination of the different binder content between a dry pressed sheet and a tape cast layer which is inherent in their fabrication process as well to the different internal stresses as a result of their particular processing techniques. As a result, during de-binding or firing of the green sheets such differential shrinkage can cause the tape cast layer to de-laminate from the dry pressed sheets or even crack.

To mitigate this problem, in an alternative embodiment of the present invention, the dielectric layer can be fabricated from an additional dry pressed green sheet. Instead of laminating the metallization layer with a tape cast layer 95 described with reference to FIG. 13 above, in the alternative embodiment of the present invention, the tape cast layer is replaced with an additional dry pressed green sheet; the additional dry pressed sheet representing the dielectric layer. Thus, in this particular embodiment, the laminated assembly comprises two outermost dry pressed layers having a thickness of about 6 mm and a centre dry pressed layer sandwiched between the two outmost dry pressed layer and having a thickness of about 2.5 mm, i.e. the laminated assembly comprises three dry pressed green sheets instead of the two dry pressed green sheets. In the cross-section of the fired part 68 shown in FIG. 9, the dielectric layer is thus referenced by the layer 86 above the metallization layer 78. Repeating the processing steps described above with reference to FIG. 13 but replacing the tape cast layer with an additional dry pressed layer (see FIG. 14);

1. two dry pressed green sheets 91, 92 (e.g. each of approximately 1 mm or 2.5 mm or 6 mm thickness) may have Mo based paint (Wesgo®538 paint, thickness ~25 μm) to define a heater pattern 93 on one outer dry pressed green sheet 91 and an electrostatic chuck pattern 4 on the other (central) dry pressed green sheet 92. As discussed above, one of the dry pressed sheet has a thickness $d_1$ of about 6 mm which shrinks to a thickness, $d_1'$, of about 5 mm after firing and represents the outside sheet 91 or layer and another dry pressed sheet has a thickness $d_2$ of about 2.5 mm which shrinks to a thickness, $d_2'$, of about 2 mm after firing and represents the centre sheet 92.
2. The two layers of dry pressed green sheet may be aligned with a further outer dry pressed green sheet 98 also having a thickness $d_4$ of about 6 mm and will form the dielectric layer 95, i.e. the laminated assembly comprises two outer dry pressed sheets 91, 98, each having a thickness $d_1$, $d_4$ of about 6 mm in the green state and a centre dry sheet 92 having a thickness $d_2$ of about 2.5 mm in the green state. The heater pattern 93 lies between the two dry pressed sheets 91, 92 and the electrostatic chuck pattern 94 lies between the dry pressed green sheet 92 and a further dry pressed green sheet 98; as discussed above suitable holes or vias 96 in layers 91 and 92 can be provided for subsequent forming of feedthroughs to the electrostatic chuck pattern and heater pattern;
3. the assembly of the three layers of dry pressed green sheets 91, 92 and 98 can then be vacuum bagged together with a support plate and laminated together using an isostatic press in the same manner as described above.

After firing using the flat firing process discussed above, the laminated assembly forms a monolithic-metal composite part (see FIG. 9). To achieve the required thinness and maintain the flatness of the dielectric layer so as to provide an adequate electrostatic force when cooperating with the underlying metallization layer 78 forming the electrodes, after firing and densification of the assembly, the top dry pressed sheet 98 is machined down to the required thickness $d_3$ tolerance suitable to behave as a dielectric layer 95. In the particular embodiment, the top dry pressed layer 98 is machined down from a densified or fired thickness of about 5 mm (taking the green thickness to be approximately 6 mm) to about 0.1 mm. For ease of explanation, the top fired dry pressed layer shrinks from a thickness of $d_4$ to $d_4'$ (see FIG. 14). Thus, the material removed ($d_4'-d_3$) from the top dry pressed layer 98 during machining is shown in dashed lines. In reality, at least one face of the densified monolithic-metal composite is machined down so as to provide an insulating ceramic layer of thickness approximately 0.1 mm above the metallization layer 78 or the electrostatic chuck pattern (see FIG. 11). The top layer ceramic layer 98 can be machined down by grinding but other machining processes known in the art to achieve such tight thickness tolerances is permissible in the present invention. In the particular embodiment of the present invention, a two stage machine process is used to form the dielectric layer after densification; the first stage covers removing the bulk of the ceramic material to the approximate thickness value, $d_3$ and the second machining stage gives a final polishing stage. At the first stage of machining, one face of the monolithic composite is ground down to a required thickness using a grinding face comprising diamond grit, e.g. the diamond having a particle size in the range of substantially 20 μm to 100 μm, to a thickness of approximately 0.1 mm from the metallization layer 78 below. The required thickness of the dielectric layer can be substantially less than 1 mm or less than 0.5 mm or less than 0.25 mm, or less than 0.1 mm. In the particular embodiment, the thickness of the dielectric layer is approximately 0.1 mm. The second stage of the machining process involves polishing the ground surface to provide a mirror-like finish whilst maintaining the flatness of the surface of the dielectric layer. In the particular embodiment, the ground surface of the outer layer 98 that represents the dielectric layer is polished using 1 μm-5 μm diamond paste to a thickness tolerance of 0.01 mm, preferably 0.001 mm.

FIGS. 10 and 11 shows a top plan view showing the metallization layer extending parallel to the plane or planar surface of the dry pressed sheet and a cross-sectional view respectively along the line Y-Y of the machined down fired laminated part shown in FIG. 9. To demonstrate the thinness of the top dielectric ceramic layer, the underlying metallization layer representing the electrostatic chuck pattern electrodes 78 (see FIG. 9) becomes more visible externally from the surface of the dielectric layer. In the cross section shown in FIG. 11, the electrostatic chuck comprises an insulating base 88, the top metallization layer 78 forming the electrodes disposed on the insulating base 88 and a dielectric top layer 86 disposed between the insulating base 88 and the dielectric top layer 86.

The number of metalized dry pressed green sheets in the assembly depends upon whether the assembly is purely used as an ESC or a combination of an ESC together with a heater. For example, in the case where the ECS is used to retain the semiconductor wafer for cleaning purposes or etching etc., no heater may be required and the metallization layer 76 that represents the heater can simply be absent, i.e. the ESC comprises an electrostatic electrode pattern 78 sandwiched between two dry pressed green sheets. Where the ESC is used in combination with a heater, then the number of metallization layers increases; one metallization layer provides the electrodes 78 that cooperate with the dielectric layer 86 to generate an electrostatic field for electrostatically clamping a substrate (semiconductor wafer) in use and a further metallization layer 76 is applied on another dry pressed green sheet to permit electrical heating.

Different combinations of dry pressed green sheets and metallization layers representing the electrostatic pattern and/or heater pattern and/or voids is/are permissible in the present invention, each combination depends on their particular application, e.g. electrostatic clamping purposes or a combination of electrostatic clamping and heating or cooling.

The present invention has the advantages of providing an HTCC process suited for the manufacture of large objects, and does not require either hot pressing or the handling of delicate wire meshes [as does U.S. Pat. No. 6,225,606].

Further features, modifications and uses of the invention will be apparent to the skilled person desiring to make objects by high temperature co-firing, and are encompassed within the scope of this invention.

The invention claimed is:

1. A method of forming one or more high temperature co-fired ceramic electrostatic chucks, suitable for hot ion implantation having an orthogonal dimension Z less than the X and Y dimensions, comprising:
    a) forming one or more green compacts using alumina having a purity of 90-99.99%, by a process comprising dry pressing a powder comprising ceramic and organic binder to form each of the one or more green compacts;
    b) disposing a conductor or conductor precursor to at least one surface layer of at least one of the one or more green compacts to form at least one heater patterned green compact and an electrode chuck patterned green compact;
    c) assembling an insulating green tape cast layer, which functions as a dielectric layer, to the electrostatic chuck electrode patterned green compact to form a laminated assembly;
    d) isostatically pressing the laminated assembly to form a pressed laminated assembly;
    e) firing the pressed laminated assembly at a temperature sufficient to sinter the alumina of the one or more green compacts and the insulating green tape cast layer together and to mould around the deposited conductor or conductor precursor to form a monolithic ceramic body with one or more electrically conductive electrodes embedded therein which function as electrical heating elements capable of thermal cycling between room temperature and 600° C. with good temperature uniformity; wherein step (e) further comprises:
        i. supporting the pressed laminated assembly on an insulating setter having at least one substantially flat surface;
        ii. mounting an insulating weight having at least one substantially flat surface on the pressed laminated assembly such that the pressed laminated assembly lies between the substantially flat surface of the insulating setter and the insulating weight.

2. The method as claimed in claim 1, wherein the at least one surface of the setter and/or weight is/are machined substantially flat.

3. The method as claimed in claim 1, wherein step (b) comprises applying a metallization layer to at least one surface of at least one of the one or more of the green compacts to form the at least one patterned green compact.

4. The method as claimed in claim 1, wherein the one or more green compacts comprise at least two green compacts, where step (c) further comprises positioning one or more shapes formed from a fugitive material between the at least two green compacts, whether either or both is patterned or not; and subsequent to step (d or e), the fugitive material is removed to leave hollow channels within the one or more high temperature co-fired ceramic articles.

5. The method as claimed in claim 1, wherein the one or more high temperature co-fired ceramic articles have an orthogonal dimension Z less than 10% of the longer of the X and Y dimension.

6. The method as claimed in claim 1, wherein the one or more high temperature co-fired ceramic articles have an orthogonal dimension Z less than 10% of the shorter of the X and Y dimension.

7. The method as claim in claim 1, wherein the dielectric layer is less than half the thickness of an adjacent dry pressed green compact, such that the dry pressed green compact suppresses the lack of uniformity of the shrinkage of the tape cast material.

8. A method of forming one or more high temperature co-fired ceramic electrostatic chucks having an orthogonal dimension Z less than the X and Y dimensions, comprising:
   a) forming one or more green compacts using alumina having a purity of 90-99.99%, by a process comprising dry pressing a powder comprising ceramic and organic binder to form each of the one or more green compacts;
   b) disposing a conductor or conductor precursor to at least one surface layer of at least one of the one or more green compacts to form at least one electrode chuck patterned green compact;
   c) assembling an insulating green tape cast layer, which functions as a dielectric layer, to the electrostatic chuck electrode patterned green compact to form a laminated assembly;
   d) isostatically pressing the laminated assembly to form a pressed laminated assembly;
   e) firing the pressed laminated assembly at a temperature sufficient to sinter the alumina of the one or more green compacts and the insulating green tape cast layer together and to mould around the deposited conductor or conductor precursor to form a monolithic ceramic body with one or more electrically conductive electrodes embedded therein, said tape cast layer being less than half the thickness of an adjacent dry pressed green compact, such that the dry pressed green compact suppresses the lack of uniformity of the shrinkage of the dielectric layer; wherein step (e) further comprises:
   i. supporting the pressed laminated assembly on an insulating setter having at least one substantially flat surface;
   ii. mounting an insulating weight having at least one substantially flat surface on the pressed laminated assembly such that the pressed laminated assembly lies between the substantially flat surface of the insulating setter and the insulating weight.

9. The method as claimed in claim 8, wherein the tape cast layer is less than a quarter the thickness of an adjacent dry pressed green compact.

10. The method as claimed in claim 8, wherein the tape cast layer is less than a tenth the thickness of an adjacent dry pressed green compact.

11. The method as claimed in claim 8, wherein the electrostatic chuck comprises two dry pressed green compacts and one tape cast layer.

12. The method as claimed in claim 11, wherein a heater pattern lies between the two dry pressed green compacts and the electrostatic chuck pattern lies between the dry pressed green compact and the tape cast layer.

13. The method as claimed in claim 8, wherein the density of the one or more green compact after isostatic pressing is about 3.9 g/cc.

* * * * *